(12) United States Patent
Liu et al.

(10) Patent No.: US 10,283,448 B2
(45) Date of Patent: May 7, 2019

(54) MULTIPLE METAL LAYER SEMICONDUCTOR DEVICE AND LOW TEMPERATURE STACKING METHOD OF FABRICATING THE SAME

(71) Applicant: Taiwan Semiconductor Manufacturing Company, Ltd., Hsin-Chu (TW)

(72) Inventors: Ping-Yin Liu, Taipei County (TW); Kai-Wen Cheng, Taichung (TW); Xin-Hua Huang, Changhua County (TW); Lan-Lin Chao, Taipei County (TW); Chia-Shiung Tsai, Hsin-Chu (TW); Xiaomeng Chen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/887,142

(22) Filed: Feb. 2, 2018

(65) Prior Publication Data

US 2018/0226337 A1 Aug. 9, 2018

Related U.S. Application Data

(62) Division of application No. 13/651,045, filed on Oct. 12, 2012, now Pat. No. 9,887,155.

(60) Provisional application No. 61/707,793, filed on Sep. 28, 2012.

(51) Int. Cl.
 *H01L 23/522* (2006.01)
 *H01L 21/768* (2006.01)

(52) U.S. Cl.
 CPC ........ *H01L 23/522* (2013.01); *H01L 21/7684* (2013.01); *H01L 2924/0002* (2013.01)

(58) Field of Classification Search
 None
 See application file for complete search history.

(56) References Cited

U.S. PATENT DOCUMENTS

| | | |
|---|---|---|
| 6,573,148 B1 | 6/2003 | Bothra |
| 7,385,283 B2 | 6/2008 | Wu et al. |
| 2003/0015799 A1 | 1/2003 | Abiru et al. |
| 2009/0115001 A1 | 5/2009 | Liu et al. |
| 2009/0250725 A1 | 10/2009 | Hussain et al. |
| 2009/0294916 A1 | 12/2009 | Ma et al. |
| 2010/0248412 A1 | 9/2010 | Guidash |
| 2012/0080792 A1* | 4/2012 | Zhao ................ H01L 21/76834 257/751 |
| 2013/0029471 A1 | 1/2013 | Pinto et al. |

(Continued)

*Primary Examiner* — Bradley Smith
(74) *Attorney, Agent, or Firm* — Haynes and Boone, LLP

(57) ABSTRACT

A method of fabricating a semiconductor device includes providing a first substrate comprising a first conductive element exposed at a surface of the first substrate; forming a patterned photoresist layer atop the first conductive element, whereby the patterned photoresist layer provides openings exposing the first conductive element; forming a first metal layer in the openings and directly atop the first conductive element; forming a first insulator layer over the first metal layer and the first substrate; and polishing the first metal layer and the first insulator layer, resulting in a first interface surface over the first substrate wherein the first interface surface includes part of the first metal layer and the first insulator layer.

20 Claims, 13 Drawing Sheets

(56) References Cited

U.S. PATENT DOCUMENTS

2014/0091438 A1     4/2014    Liu et al.
2014/0362267 A1    12/2014    Kagawa et al.

* cited by examiner

Low Temp. Stacking

MULTIPLE METAL LAYER SEMICONDUCTOR DEVICE AND LOW TEMPERATURE STACKING METHOD OF FABRICATING THE SAME

PRIORITY DATA

This is a divisional of U.S. patent application Ser. No. 13/651,045 filed Oct. 12, 2012, which claims priority to U.S. Provisional App. Ser. No. 61/707,793 filed Sep. 28, 2012, the disclosure of both applications are incorporated herein by reference in their entirety.

BACKGROUND

Conventional wafer bonding techniques are generally categorized as fusion, eutectic or hybrid bonds. Fusion bonding is the adhesion of two substrates placed in direct contact with each other. At room temperature, the substrates bond to one another following a chemical or plasma activation step. Eutectic bonding is the adhesion of two substrates, having a eutectic metal layer positioned between them, where the metal transforms directly from a solid to liquid state, or vice versa, at a specific composition and temperature. A hybrid bond, as the name implies, is simply a combination of the fusion and eutectic bonds.

A variety of drawbacks accompany conventional boding techniques. For example, the fusion bond provides no electrical contacts between the substrates. As such, further costly processing of the wafer is necessary to achieve interconnection of the metal layers. Eutectic bonding requires high compressive forces and temperatures, resulting in poor accuracy and potentially damaging mechanical stresses. Lastly, loading associated with polishing techniques (e.g., planarization), dishing and oxidation are all concerns in hybrid bonding.

BRIEF DESCRIPTION OF THE DRAWINGS

The present disclosure is best understood from the following detailed description when read in conjunction with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
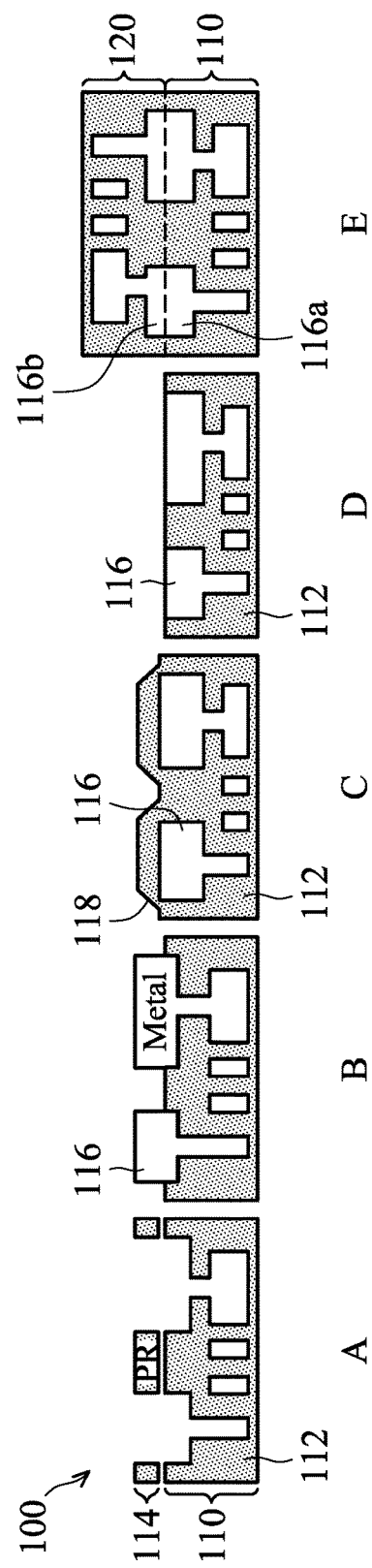
FIG. 1 is a diagrammatical cross-sectional view of a device during various steps of a an exemplary methodology of the present invention.
Figure 2A:
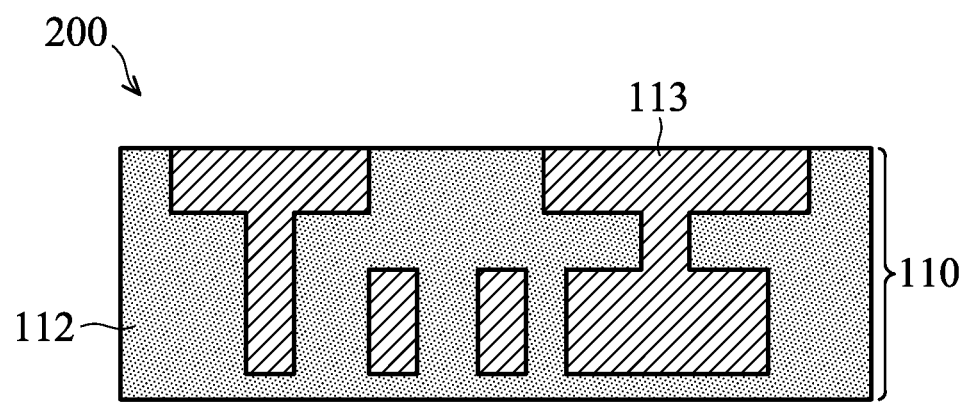
FIGS. 2-4 are diagrammatical cross-sectional views of alternative devices during various steps of exemplary methodologies of the present invention.
Figure 2B:
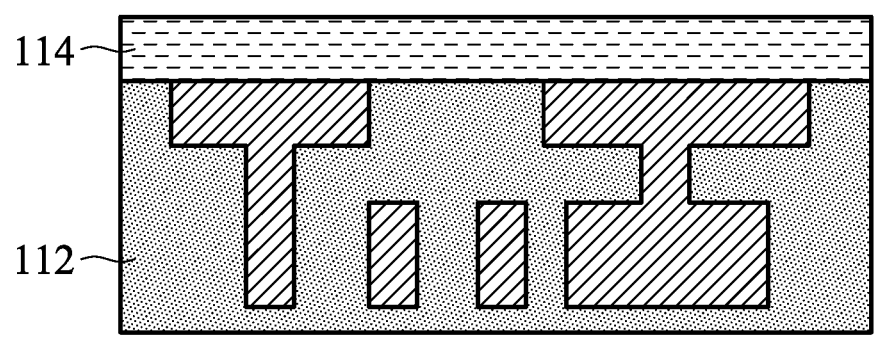
Figure 2C:
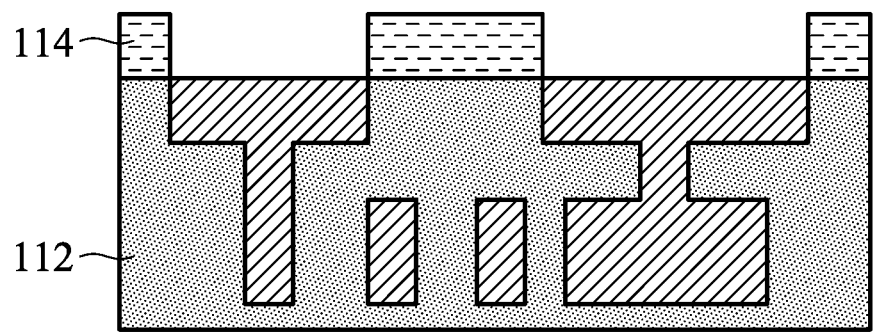
Figure 2D:
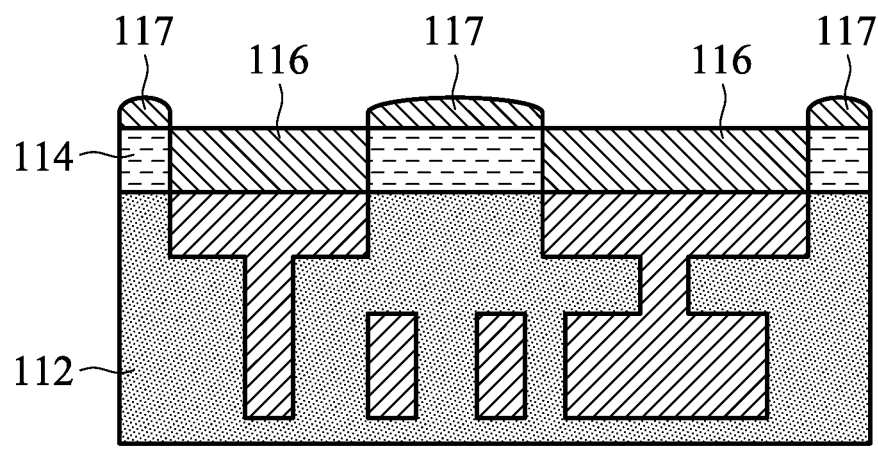
Figure 2E:
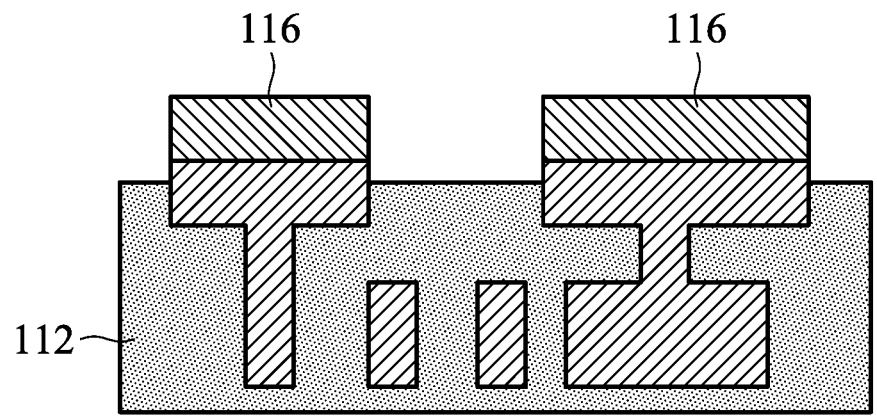
Figure 2F:
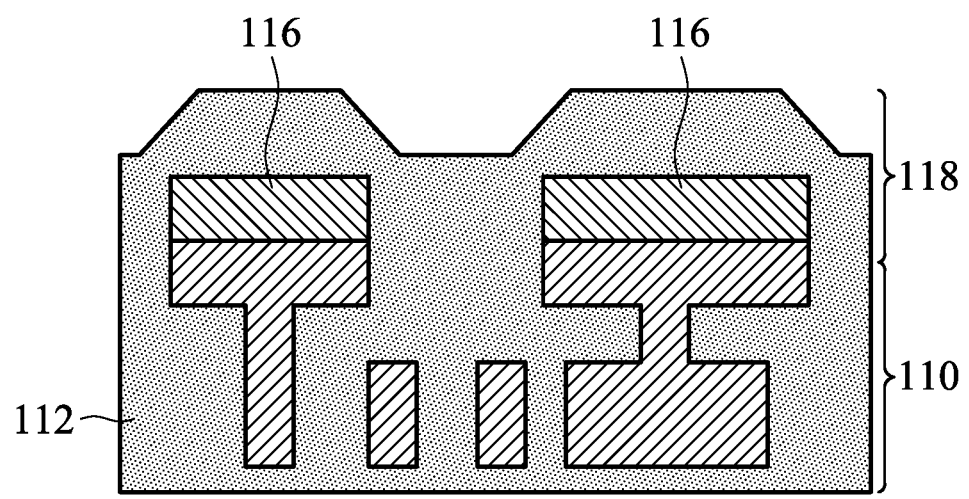
Figure 2G:
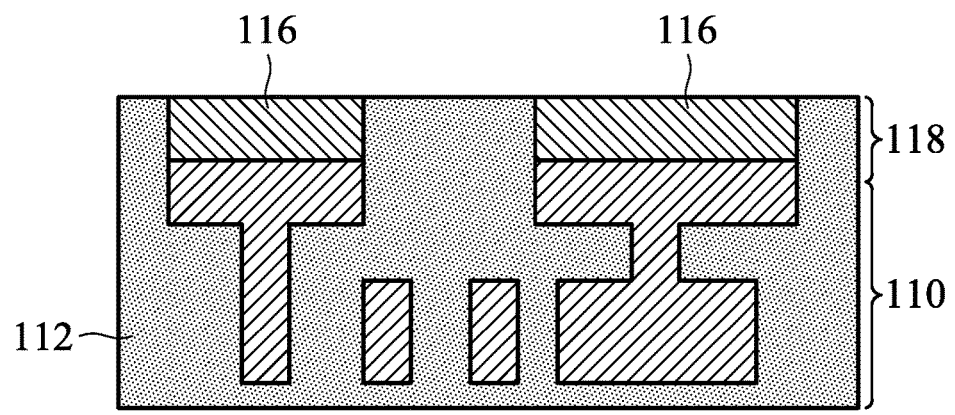
Figure 2H:
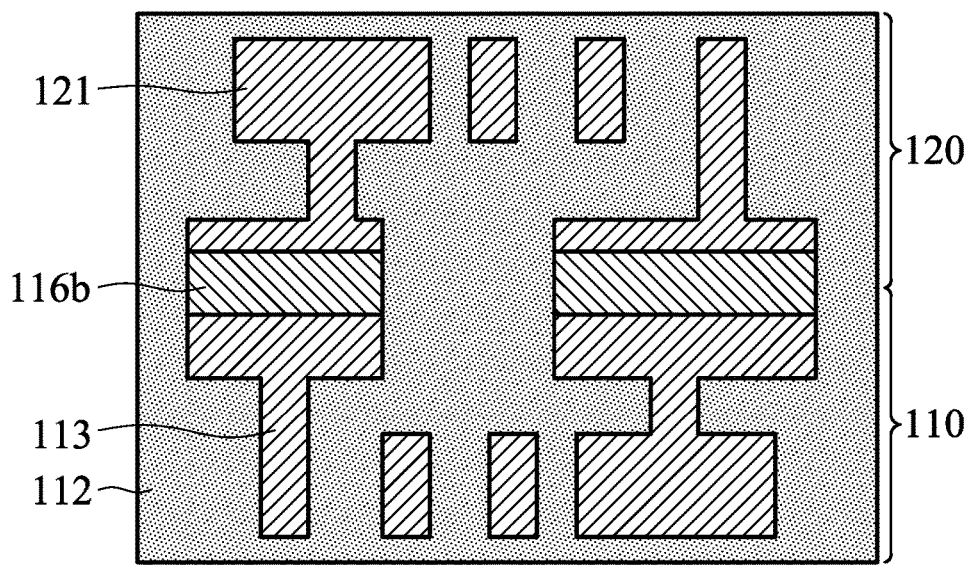
Figure 3A:
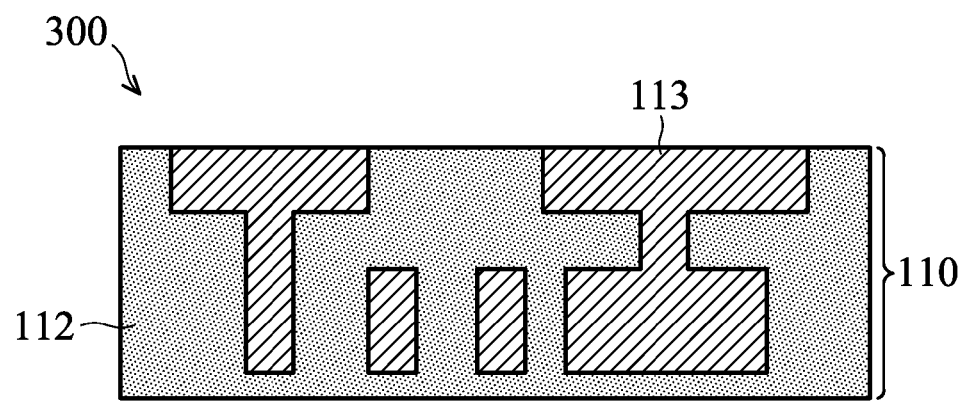
Figure 3B:
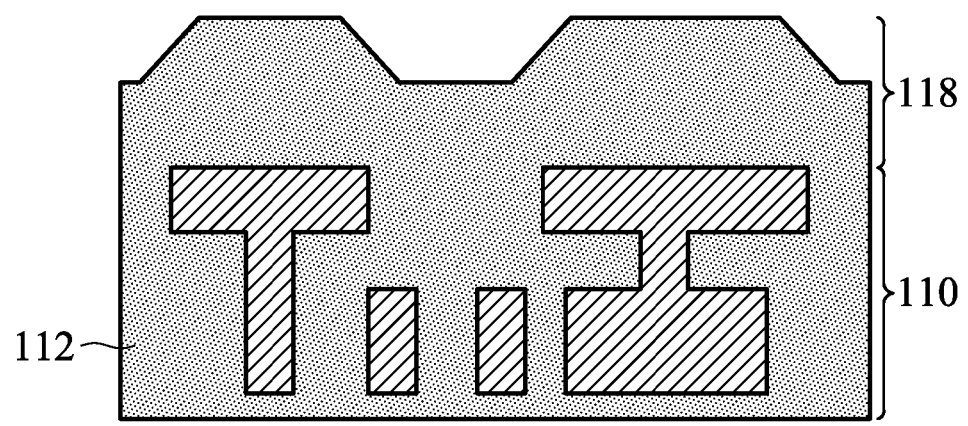
Figure 3C:
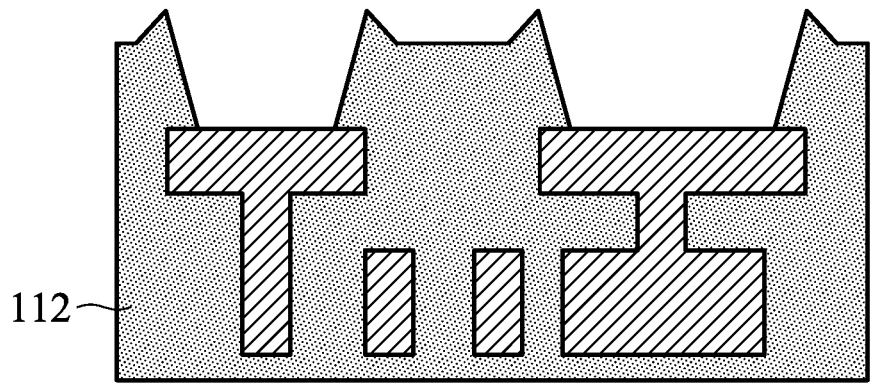
Figure 3D:
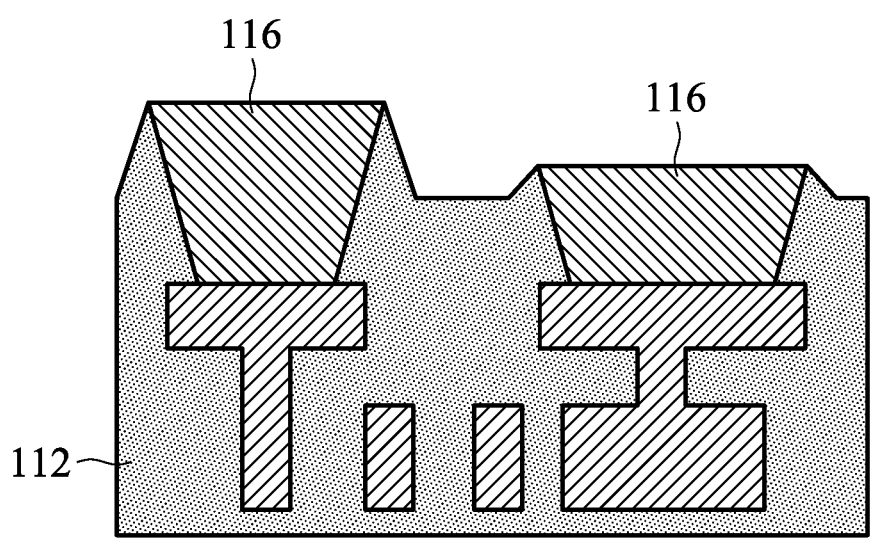
Figure 3E:
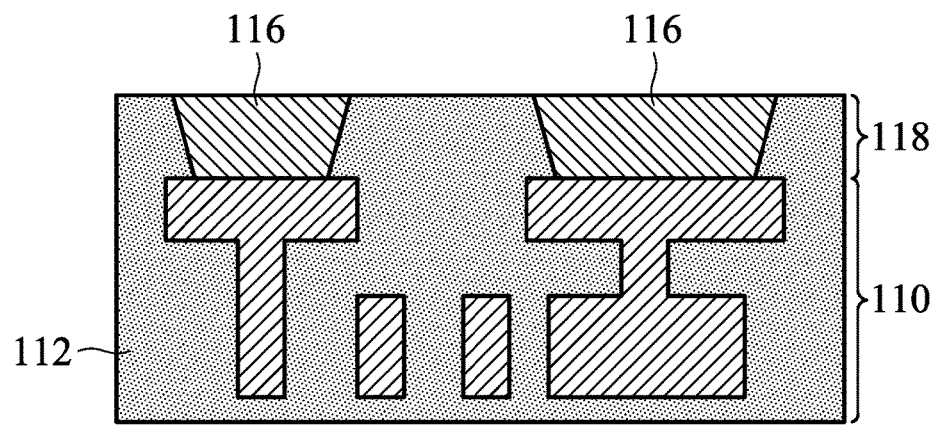
Figure 3F:
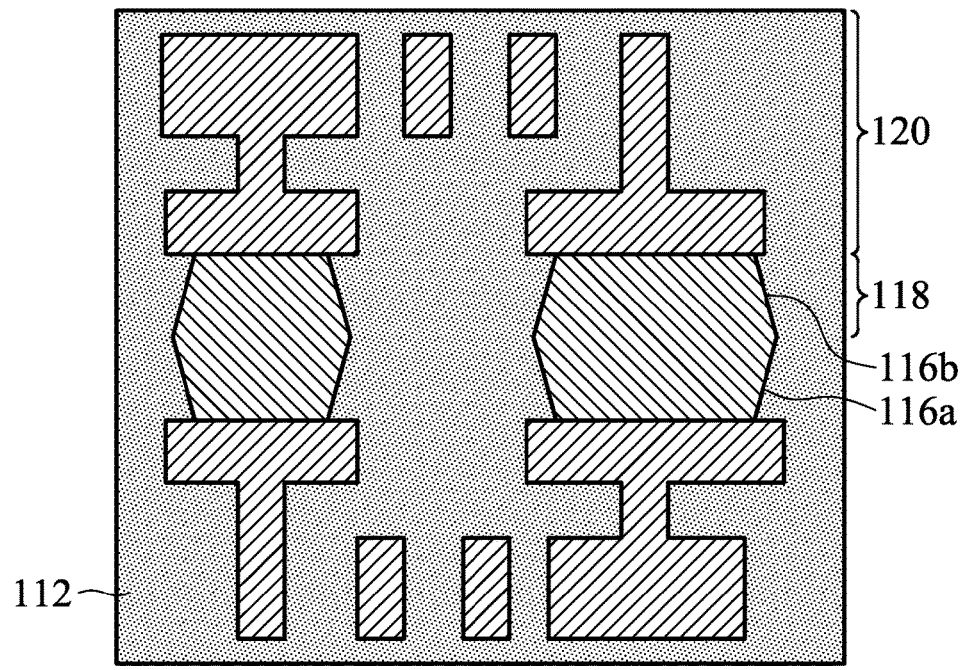
Figure 4A:
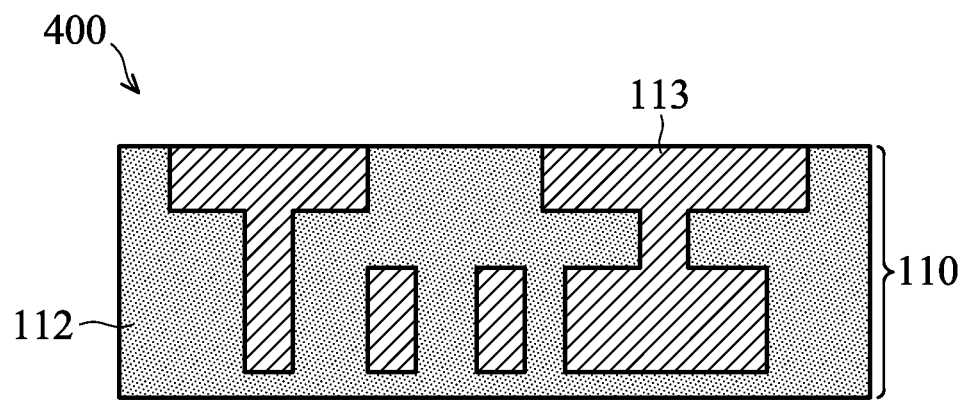
Figure 4B:
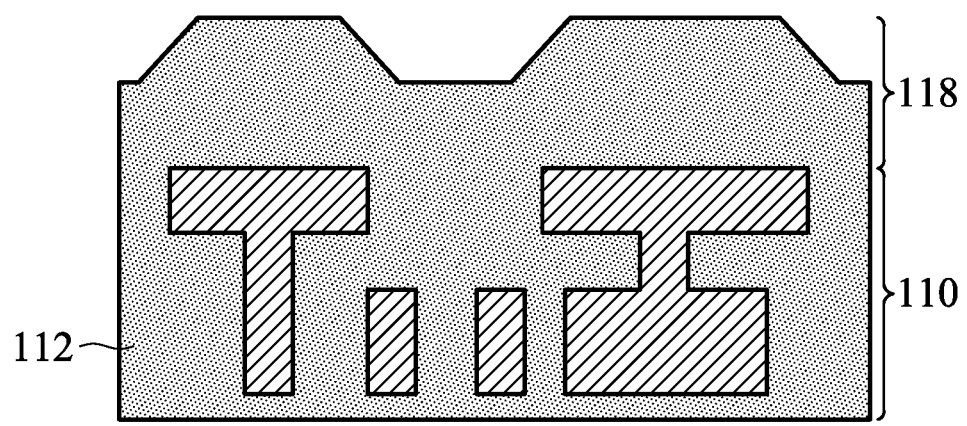
Figure 4C:
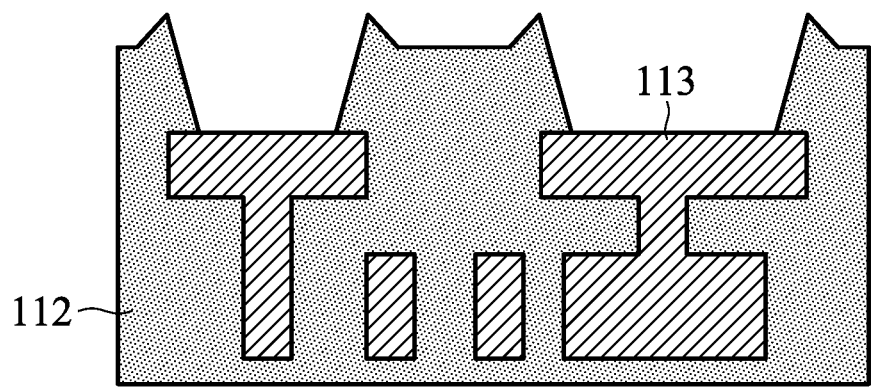
Figure 4D:
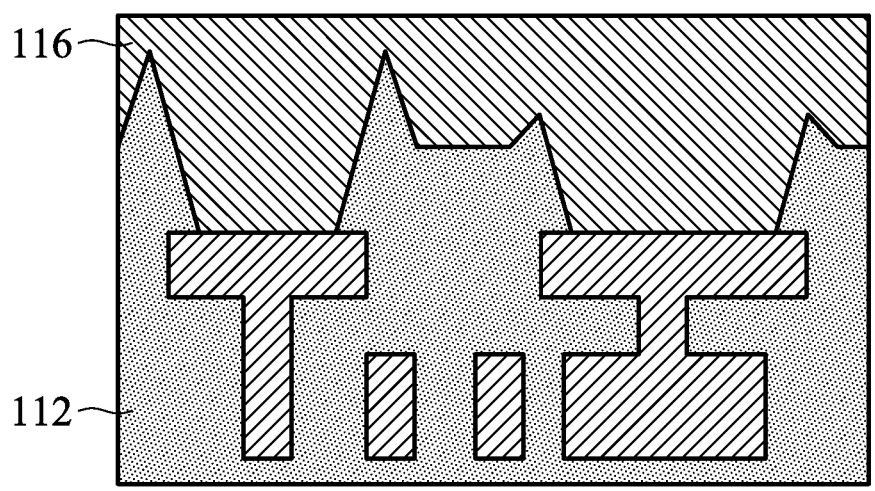
Figure 4E:
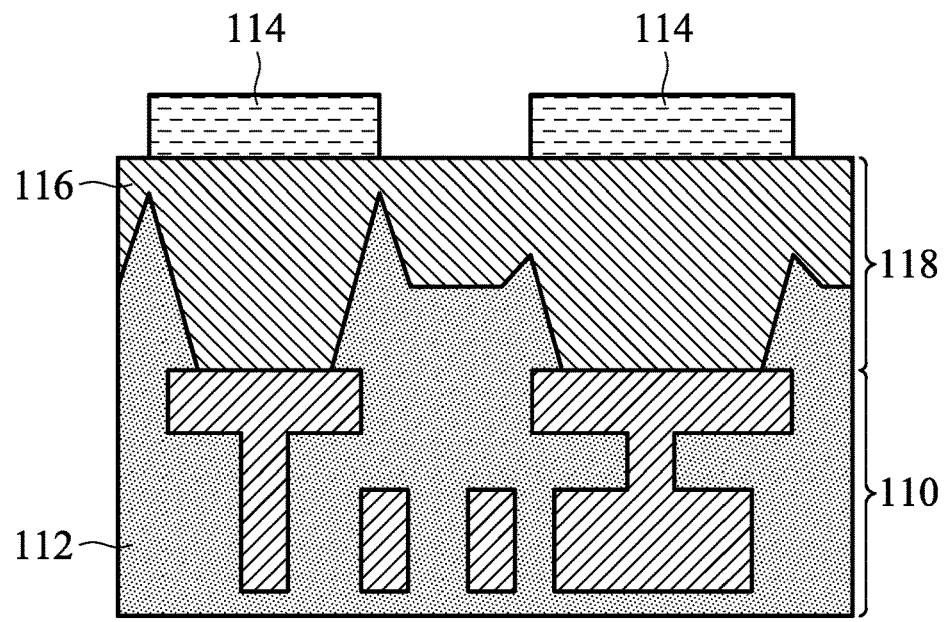
Figure 4F:
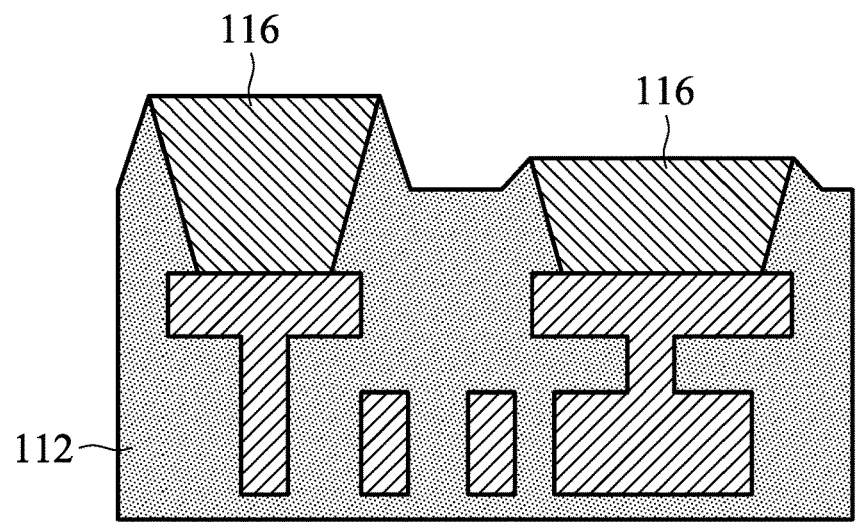
Figures 4G, 4H:
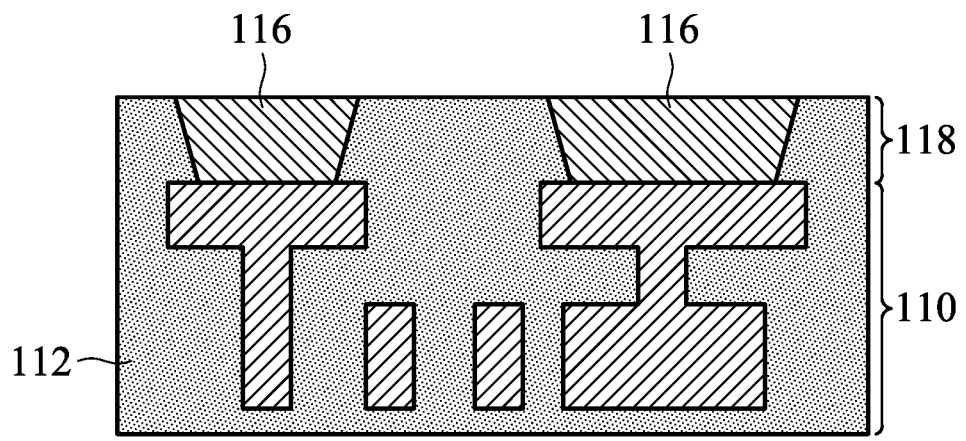

The following disclosure provides many different embodiments, or examples, for implementing different features of the invention. Specific examples of components and arrangements are described below to simplify the present disclosure. These are, of course, merely examples and are not intended to be limiting. For example, descriptions of a first feature "on" or "over" a second feature (and like descriptions) may include embodiments where the first and second features are in direct contact, and may also include embodiments where additional features are interposed between the first and second features. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 provides a diagrammatic cross-sectional view of a device 100, in portion or entirety, at various stages of an exemplary fabrication process. Device 100 includes a substrate having a variety of interconnections disposed therein. In addition, the substrate may include an integrated circuit device comprising any variety of passive and/or active devices disposed therein. FIG. 1 has been simplified for the sake of clarity to better understand the inventive concepts of the present disclosure. Additional features can be added in the device 100, and some of the features described below can be replaced or eliminated for additional embodiments of the device 100.

Still referring to FIG. 1, device 100 includes a substrate 110. In this exemplary embodiment, substrate 110 is a semiconductor substrate, such as a silicon substrate. Alternatively or additionally, the semiconductor substrate includes an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof. Furthermore, substrate 110 may also be a semiconductor on insulator.

A plurality of conductive elements 112 are disposed within substrate 110. Conductive elements 112 comprise both horizontal and vertical interconnects, such as contacts and/or vias, such as conductive lines. In this exemplary embodiment, the metal utilized in conductive elements 112 is copper. However, in the alternative, other exemplary metals utilized in conductive elements 112 may include aluminum, aluminum/silicon/copper alloy, titanium, titanium nitride, tantalum, tantalum nitride, tungsten, polysilicon, metal silicide, or combinations thereof. Conductive elements 112 may be formed by processes including physical vapor deposition (PVD), chemical vapor deposition (CVD), or combinations thereof.

Other manufacturing techniques to form the various conductive elements 112 may include photolithography processing and etching to pattern conductive materials to form the vertical and horizontal interconnects. Still other manufacturing processes may include thermal annealing to form metal silicide. The metal silicide used in conductive elements 112 may include nickel silicide, cobalt silicide, tungsten silicide, tantalum silicide, titanium silicide, platinum silicide, erbium silicide, palladium silicide, or combinations thereof. Alternatively, conductive elements 116 may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. It is understood that conductive elements 112 are not limited by the number, material, size, and/or dimension of those illustrated, and thus, may include any number, material, size, and/or dimension of conductive features depending on design requirements of the device 100.

In the depicted exemplary embodiment, substrate 110 may further include various layers that are not separately depicted and that combine to form various microelectronic elements that may include: transistors (for example, metal-oxide-semiconductor field-effect transistors (MOSFETs) including CMOS transistors, bipolar junction transistors, high voltage transistors, high frequency transistors, p-channel and/or n-channel field-effect transistors (PFETs/NFETs), resistors, diodes, capacitors, inductors, fuses, other suitable elements, or combinations thereof. The various layers may include high-k dielectric layers, gate layers, hard mask layers, interfacial layers, capping layers, diffusion/barrier layers, dielectric layers, conductive layers, other suitable layers, or combinations thereof. The various layers of the substrate 110 may also include various doped regions, isolation features, other features, or combinations thereof. Moreover, such microelectronic elements may interconnect to one another to form a portion of the substrate 110, such as a logic device, memory device (for example, a static random access memory, radio frequency device, input/output device, system-on-chip device, other suitable type of device, or combinations thereof.

Still referring to FIG. 1, fabrication of an exemplary device of the present invention will now be described. At step A, post patterning is conducted in which photolithography, for example, is utilized to apply a photo resist film 114 atop substrate 110. At step B, metal layer 116 is grown using a process such as, for example, electroplating or PVD, and photo resist film 114 and the residual metal are removed by a lift-off process, such as etching. At step C, a silicon oxide layer 118 is fabricated atop metal layer 116 using a deposition process such as CVD. Thereafter, at step D, upper portions of metal layer 116 and oxide layer 118 (also referred to herein as "interface surface") undergo polishing (e.g., planarization), thereby resulting in a smooth surface atop substrate 110. Since conductive layer 112 (e.g., copper) is now overlaid by metal layer 116, the loading associated with the polishing is greatly reduced, thereby avoiding dishing of conductive layer 112 and the other ill-effects associated with polishing in prior art bonding techniques.

Lastly, at step E, a substrate 120, fabricated using steps A-D also, is stacked atop substrate 110 and bonded utilizing a low temperature hybrid bonding process. As shown, metal layer 116a of substrate 110 is aligned with metal layer 116b of substrate 120. In an exemplary embodiment, metal layers 116a,b are comprised of the same metal. However, in an alternative embodiment, metal layers 116a,b may be comprised of different metals. Accordingly, device 100 has been fabricated as a stacked semiconductor device having multiple metal layers.

A low temperature bonding process is achieved in this exemplary embodiment because most of the interface between the substrates 110,120 is an oxide-oxide or silicon-silicon fusion-type interface, as opposed to a metal-metal eutectic-type interface. Therefore, the temperature required to achieve eutectic bonding of metal layers 116a,b is low. Moreover, the bonding temperature may be adjusted as desired by appropriate selection of the metals used in layers 116a,b, as would be understood by one ordinarily skilled in the art having the benefit of this disclosure.

FIG. 2 illustrates diagrammatic cross-sectional views of another exemplary device 200, in portion or entirety, at various stages of fabrication according to an alternate exemplary methodology of the present invention. The embodiment of FIG. 2 is similar in many respects to the embodiment of FIG. 1. As such, similar features and/or fabrication steps will not be reiterated in detail below. Accordingly, similar features in FIG. 2 are identified by the same reference numerals for clarity and simplicity, as FIG. 2 has been simplified for the sake of clarity to better understand the inventive concepts of the present disclosure. Additional features can be added in the device 200, and some of the features described below can be replaced or eliminated in other embodiments of the device 200.

Device 200 comprises a substrate 110 that may include a variety of elementary semiconductors, interconnections and/or integrated circuits and components, as previously described. A plurality of conductive elements 112 are disposed within substrate 110, which may be comprised of a number of conductive metals, sizes, dimensions, etc., as would be understood by those ordinarily skilled in the art having the benefit of this disclosure. Moreover, in the depicted exemplary embodiment, substrate 110 may further include various layers that are not separately depicted and that combine to form various microelectronic elements such as, for example, transistors, diodes, gates, dielectric layers, doped regions, logic devices, etc.

Still referring to FIG. 2, fabrication of an exemplary device of the present invention will now be described. In step A, device 200 is fabricated as described above. At step B, photo resist film 114 is fabricated atop substrate 110, and patterned as desired in step C. Photo resist film 114 may be, for example, a dry-film comprising a thick or normal photo resist material. At step D, metal layer 116 is grown using an electroplating or electroless plating process, for example. However, in an alternative embodiment, a PVD process may also be utilized. As understood by those ordinarily skilled in the art having the benefit of this disclosure, before metal layer 116 is grown, a seed layer may be required. In this exemplary embodiment, metals utilized in metal layer 116 may be a pure metal such as, for example, Co, Ru, Ge, Sn, Ta, W, Ti, In, W, Cr, Au, Ag or Fe, and have a thickness greater that 5 A. In the alternative, the metals could also be composite metals such as, for example, NiFe, PtMn, AlCu, CoWP, AlGe or CuSn, and have a thickness greater than 5 A.

Photo resist film 114 and the residual metal 117 are then removed by a lift-off process, such as etching at step E. Thereafter, metal layer 116 and a portion of conductive elements 112 are exposed. At step F, an oxide layer 118 is fabricated atop metal layer 116 and conductive elements 112. Oxide layer 118 may be comprised of silicon oxide, thus serving as an insulator to isolate the individual conductive elements 112. Thereafter, at step G, upper portions of metal layer 116 and oxide layer 118 (i.e., interface surface) undergo polishing (e.g., planarization), thereby resulting in a smooth surface atop substrate 110. Since conductive layer 112 (e.g., copper) is now overlaid by metal layer 116, the loading associated with the polishing is greatly reduced, thereby avoiding dishing of conductive layer 112 and the other ill-effects associated with polishing in prior art bonding techniques.

In this exemplary embodiment, after polishing at step G, the surface roughness of the surface atop substrate 110 is less than 5 A. Thereafter, at step H, a substrate 120, fabricated using steps A-G also, is stacked atop substrate 110 and bonded utilizing a low temperature hybrid bonding process. In certain exemplary embodiments, the bonding temperature is less than 100 C. As shown, metal layer 116a of substrate 110 is aligned with metal layer 116b of substrate 120. In an exemplary embodiment, metal layers 116a,b are comprised of the same metal. However, in an alternative embodiment, metal layers 116a,b may be comprised of different metals. Accordingly, device 200 has been fabricated as a stacked semiconductor device having multiple metal layers grown using an electroplating, electroless plating, selective deposition or PVD process.

As previously described, the low temperature bonding process of this exemplary methodology is achieved because most of the interface between the substrates 110,120 is an oxide-oxide or silicon-silicon fusion-type interface, as opposed to a metal-metal eutectic-type interface. Therefore, the temperature required to achieve eutectic bonding of metal layers 116a,b is low. Moreover, the bonding temperature may be adjusted as desired by appropriate selection of the metals used in layers 116a,b, as would be understood by one ordinarily skilled in the art having the benefit of this disclosure.

FIG. 3 illustrates diagrammatic cross-sectional views of another exemplary device 300, in portion or entirety, at various stages of fabrication according to an alternate exemplary methodology of the present invention. The embodiment of FIG. 3 is similar in many respects to the embodiment of FIGS. 1 and 2. As such, similar features and/or fabrication steps will not be reiterated in detail below. Accordingly, similar features in FIG. 3 are identified by the same reference numerals for clarity and simplicity, as FIG. 3 has been simplified for the sake of clarity to better understand the inventive concepts of the present disclosure. Additional features can be added in the device 300, and some of the features described below can be replaced or eliminated in other embodiments of the device 300.

Device 300 comprises a substrate 110 that may include a variety of elementary semiconductors, interconnections and/or integrated circuits and components, as previously described. A plurality of conductive elements 112 are disposed within substrate 110, which may be comprised of a number of conductive metals, sizes, dimensions, etc., as would be understood by those ordinarily skilled in the art having the benefit of this disclosure. Moreover, in the depicted exemplary embodiment, substrate 110 may further include various layers that are not separately depicted and that combine to form various microelectronic elements such as, for example, transistors, diodes, gates, dielectric layers, doped regions, logic devices, etc.

Still referring to FIG. 3, fabrication of an exemplary device of the present invention will now be described. In steps A, device 300 is fabricated as described above. At step B, an oxide layer 118 is fabricated atop substrate 110 and conductive elements 112. Oxide layer 118 may be comprised of silicon oxide, thus serving as an insulator to isolate the individual conductive elements 112. At step C, oxide layer 118 is etched and conductive elements 112 exposed. At step D, metal layer 116 is grown over conductive elements 116 using electroplating or electroless plating. In the alternative, however, a PVD or CVD process may also be utilized. As previously mentioned, a seed layer may be required before metal layer 116 is grown. In this exemplary embodiment, pure metals utilized in metal layer 116 may be Co, Ru, Ge, Sn, Ta, W, Ti, In, W, Cr, Au, Ag or Fe, and have a thickness of greater than 5 A. However, composite metals may also be utilized such as, for example, NiFe, PtMn, AlCu, CoWP, AlGe or CuSn and have a thickness of greater than 5 A.

Thereafter, at step E, an upper portion of oxide layer 118 and metal layer 116 (i.e., interface surface) undergo polishing (e.g., planarization), thereby resulting in a smooth surface atop substrate 110. Since conductive layer 112 (e.g., copper) is now overlaid by metal layer 116, the loading associated with the polishing is greatly reduced, thereby avoiding dishing of conductive layer 112 and the other ill-effects associated with polishing in prior art bonding techniques.

In this exemplary embodiment, after polishing at step E, the surface roughness of the surface atop substrate 110 is less than 5 A. Thereafter, at step F, a substrate 120, fabricated using steps A-E also, is stacked atop substrate 110 and bonded utilizing a low temperature hybrid bonding process. In certain exemplary embodiments, the bonding temperature is less than 100 C. As shown, metal layer 116a of substrate 110 is aligned with metal layer 116b of substrate 120. In an exemplary embodiment, metal layers 116a,b are comprised of the same metal. However, in an alternative embodiment, metal layers 116a,b may be comprised of different metals. Accordingly, device 300 has been fabricated as a stacked semiconductor device having multiple metal layers grown using an electroplating, electroless plating, selective deposition, PCD or CVD process.

As previously described, the low temperature bonding process of this exemplary methodology is also achieved because most of the interface between the substrates 110,120 is an oxide-oxide or silicon-silicon fusion-type interface, as opposed to a metal-metal eutectic-type interface. Therefore, the temperature required to achieve eutectic bonding of metal layers 116a,b is low. Moreover, the bonding temperature may be adjusted as desired by appropriate selection of the metals used in layers 116a,b, as would be understood by one ordinarily skilled in the art having the benefit of this disclosure.

FIG. 4 illustrates diagrammatic cross-sectional views of yet another exemplary device 400, in portion or entirety, at various stages of fabrication according to an alternate exemplary methodology of the present invention. The embodiment of FIG. 4 is similar in many respects to the embodiment of FIG. 3. As such, similar features and/or fabrication steps will not be reiterated in detail below. Accordingly, similar features in FIG. 4 are identified by the same reference numerals for clarity and simplicity, as FIG. 4 has been simplified for the sake of clarity to better understand the inventive concepts of the present disclosure. Additional features can be added in the device 400, and some of the features described below can be replaced or eliminated in other embodiments of the device 400.

Device 400 comprises a substrate 110 that may include a variety of elementary semiconductors, interconnections and/or integrated circuits and components, as previously described. A plurality of conductive elements 112 are disposed within substrate 110, which may be comprised of a number of conductive metals, sizes, dimensions, etc., as would be understood by those ordinarily skilled in the art having the benefit of this disclosure. Moreover, in the depicted exemplary embodiment, substrate 110 may further include various layers that are not separately depicted and that combine to form various microelectronic elements such as, for example, transistors, diodes, gates, dielectric layers, doped regions, logic devices, etc.

Still referring to FIG. 4, fabrication of an exemplary device of the present invention will now be described. In step A, device 400 is fabricated as described above. At step B, an oxide layer 118 is fabricated atop substrate 110 and conductive elements 112. Oxide layer 118 may be comprised of silicon oxide, thus serving as an insulator to isolate the individual conductive elements 112. At step C, oxide layer 118 is etched and conductive elements 112 exposed. At step D, metal layer 116 is grown over conductive elements 116 using a PVD, CVD, electroplating or electroless plating process. In this exemplary embodiment, pure metals utilized in metal layer 116 may be Co, Ru, Ge, Sn, Ta, W, Ti, In, W, Cr, Au, Ag or Fe, and have a thickness of greater than 5 A. However, composite metals may also be utilized such as, for example, NiFe, PtMn, AlCu, CoWP, AlGe or CuSn and have a thickness of greater than 5 A.

Thereafter, at step E, a photo resist layer 114 is patterned above conductive elements 112 as desired in order to define the removal area. At step F, a stripping or plasma etching process is utilized to remove photo resist layer 114, as shown. Then, at step G, upper portions of oxide layer 118 and metal layer 116 (i.e., interface surface) undergo polishing (e.g., planarization), thereby resulting in a smooth surface atop substrate 110. Since conductive layer 112 (e.g., copper) is now overlaid by metal layer 116, the loading associated with the polishing is greatly reduced, thereby avoiding dishing of conductive layer 112 and the other ill-effects associated with polishing in prior art bonding techniques.

In this exemplary embodiment, after polishing at step G, the surface roughness of the surface atop substrate 110 is less than 5 A. Thereafter, at step H (not shown), a second substrate, fabricated using steps A-G also, is stacked atop substrate 110 and bonded utilizing a low temperature hybrid bonding process. In certain exemplary embodiments, the bonding temperature is less than 100 C. The mating metal layers will be aligned with each other, as previously described. In an exemplary embodiment, the mating metal layers 116 are comprised of the same metal. However, in an alternative embodiment, the mating metal layers 116 are comprised of different metals. Accordingly, device 400 has been fabricated as a stacked semiconductor device having multiple metal layers grown using a PVD process.

As previously described, the low temperature bonding process of this exemplary methodology is also achieved because most of the interface between the substrates 110,120 is an oxide-oxide or silicon-silicon fusion-type interface, as opposed to a metal-metal eutectic-type interface. Therefore, the temperature required to achieve eutectic bonding of metal layers 116a,b is low. Moreover, the bonding temperature may be adjusted as desired by appropriate selection of the metals used in layers 116a,b, as would be understood by one ordinarily skilled in the art having the benefit of this disclosure.

In the exemplary embodiments and methodologies described herein, a variety of wafer working paths may be utilized. For example, in a first exemplary methodology, substrates 110,120 are fabricated as described herein, and the surfaces are cleaned to remove metal oxides for example. Thereafter, substrates 110,120 undergo surface activation and a DI rinse. Then, they are bonded to one another using the hybrid bonding process. Lastly, the stacked device then undergoes an annealing process utilizing temperatures between 300-600 C, depending on the metals utilized in metal layers 116a,b.

In an alternative wafer working path, however, substrates 110,120 are fabricated again as described herein. They then undergo a DI rinse, followed by surface cleaning to remove metal oxide contaminations, for example. Each surface is then activated and the hybrid bonding is initiated. Thereafter, the stacked device undergoes annealing which utilizes temperatures between 300-600 C, depending on the metal utilized in metal layers 116a,b.

In addition, the surface cleaning stage utilized in the exemplary embodiments and methodologies described herein could include, for example, a thermal treatment under forming gas (e.g., 4% H2/N2, 4% H2/He, 4% H2/Ar, pure H2, etc.), forming acid (e.g. $HCO_2H$), HCl, plasma (e.g., H2), PCII (e.g., Ar sputter), or UV erasing under an H2 environment process. Moreover, the surface cleaning time is at least greater than 10 seconds.

The surface activation stage utilized in exemplary embodiments and methodologies described herein could be a plasma process (e.g., 100% H2, N2, He, Ar, 4% H2/N2, 4% H2/He, 4% H2/Ar, etc.), wet chemical process, or a combination of the two.

In exemplary embodiments and methodologies of the present invention, the surface cleaning and activation stage temperatures are less than 400 C and the anneal temperatures are less than 600 C. In addition, the required force during the hybrid bonding stage is less than 100N and the bond environment can be under atmosphere, vacuum, inert and forming gas (e.g., H2/N2). In order to breakthrough the metal oxide layer, however, a higher force is needed, and this force should be less than 5500N.

Figure 5:
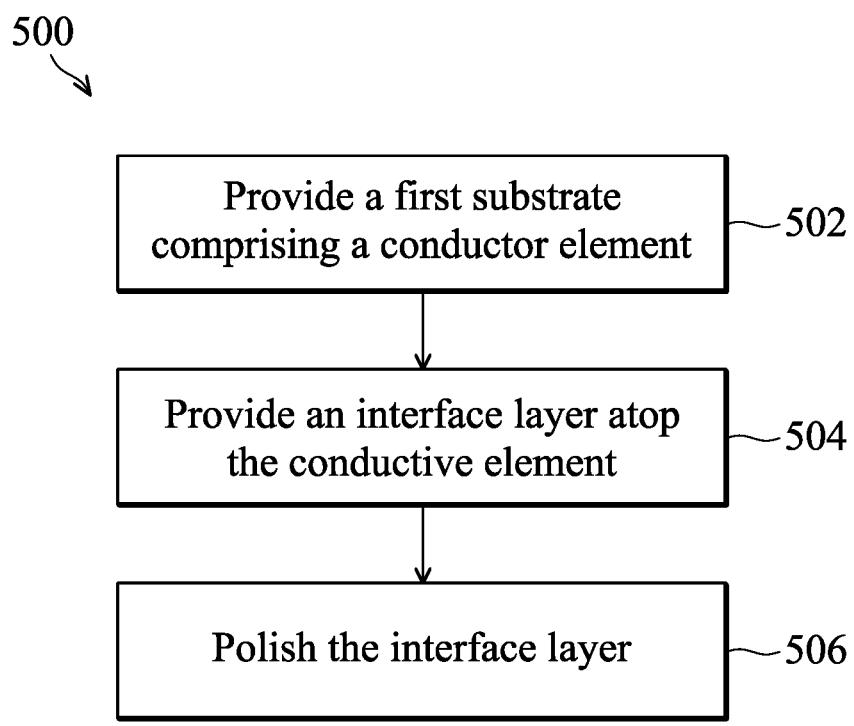
FIG. 5 is a flow chart of a method for fabricating a device according to an exemplary methodology of the present invention.

FIG. 5 is a flow chart illustrating steps in a method 500 for fabricating a device according to an exemplary embodiment of the present invention. At step 502, a first substrate is provided which includes a conductive element disposed therein. At step 504, an interface layer is provided atop the conductive element. The interface layer includes a metal layer coupled to the conductive element of the first substrate. At step 506, the interface layer is polished. Accordingly, since the interface layer overlays the conductive element, the negative loading effects associated with polishing such as, for example, planarization, are alleviated.

In the exemplary embodiments and methodologies described herein, the stacked semiconductor devices include only two substrates. However, this should not be interpreted as limiting the disclosed device to such embodiments. For example, it is contemplated that the disclosed stacked device may comprise more than two substrates. In addition, more than one metal layer may be fabricated atop the conductive elements.

In one exemplary embodiment, a method of fabricating a semiconductor device includes providing a first substrate comprising a conductive element disposed therein and providing an interface surface atop the conductive element. The interface surface includes a metal layer connected to the conductive element. The method further includes conducting a polishing process on the interface surface of the first substrate.

In another exemplary embodiment, a semiconductor device includes a first substrate having a conductive element disposed therein and an interface surface atop the conductive element. The interface surface includes a metal layer coupled to the conductive element, and the interface surface has undergone a polishing process.

In yet another exemplary embodiment, a method of fabricating a semiconductor device includes providing a first and second substrate, each including a conductive element. The method also includes providing a first metal layer directly connected to the conductive element of the first substrate and providing a second metal layer directly connected to the conductive element of the second substrate. In addition, the method includes bonding the first and second substrates together such that the first and second metal layers contact one another.

The foregoing outlines features of several embodiments so that those ordinarily skilled in the art may better understand the aspects of the present disclosure. Those skilled persons should appreciate that they may readily use the present disclosure as a basis for designing or modifying other processes and structures for carrying out the same purposes and/or achieving the same advantages of the embodiments and methodologies introduced herein. For example, although described herein as sequential steps in exemplary methodologies, those ordinarily skilled persons would realize that certain steps may be altered and varied as desired. As such, those same skilled persons should also realize that such equivalent constructions do not depart from the spirit and scope of the present disclosure, and that they may make various changes, substitutions, and alterations herein without departing from the spirit and scope of the present disclosure. Therefore, it should be understood that the invention is not intended to be limited to the particular forms disclosed. Rather, the intention is to cover all modifications, equivalents, and alternatives falling within the spirit and scope of the invention as defined by the appended claims.

What is claimed is:

1. A method of fabricating a semiconductor device, the method comprising:
   providing a first substrate comprising a first conductive element, the first conductive element including a first portion embedded within the first substrate and a second portion exposed at a surface of the first substrate;
   forming a patterned photoresist layer over the first substrate, whereby the patterned photoresist layer provides openings exposing the first conductive element;
   forming a first metal layer in the openings and directly atop the first conductive element;
   removing the patterned photoresist layer and a portion of the first substrate to expose the first portion of the first conductive element;
   forming a first insulator layer over the first metal layer and the exposed first portion of the first conductive element such that the first insulation layer physically contacts the first portion of the first conductive element; and
   polishing the first metal layer and the first insulator layer, resulting in a first interface surface over the first substrate wherein the first interface surface includes part of the first metal layer and the first insulator layer.

2. The method of claim 1, further comprising:
   providing a second substrate having a second conductive element disposed therein;
   providing a second interface surface atop the second conductive element, the second interface surface comprising a second metal layer and a second insulator layer;
   stacking the second substrate atop the first substrate, wherein the first interface surface contacts the second interface surface; and
   bonding the first and the second interface surfaces together using a hybrid bonding process, wherein:
      the first metal layer is bonded with the second metal layer using a eutectic bond; and
      the first insulator is bonded with the second insulator using a fusion bond.

3. The method of claim 2, further comprising polishing the second metal layer and the second insulator layer before the stacking.

4. The method of claim 2, wherein the first and the second metal layers include same metals.

5. The method of claim 2, wherein the first and the second metal layers include different metals.

6. The method of claim 2, wherein the bonding of the first and the second interface surfaces is performed at a bonding temperature of between room temperature and 100 C.

7. The method of claim 1, wherein at least one of an electroplating, electroless plating, or physical vapor deposition process is utilized to form the first metal layer.

8. The method of claim 1, wherein the first insulator layer includes an oxide layer.

9. A method of fabricating a semiconductor device, the method comprising:
   providing a first substrate having a first conductive element, the first conductive element including a first portion embedded within the first substrate and a second portion exposed at a surface of the first substrate;
   providing a first interface surface atop the first conductive element by:
      fabricating a first metal layer atop the first conductive element;
      removing a portion of the first substrate to expose the first portion of the first conductive element;
      fabricating a first insulator atop the first metal layer and on the exposed first portion of the first conductive element such that the first insulator layer physically contacts the first portion of the first conductive element; and
      conducting a polishing process on the first interface surface, the first interface surface comprising the first metal layer and the first insulator;
   providing a second substrate having a second conductive element;
   providing a second interface surface atop the second substrate, the second interface surface comprising a second metal layer and a second insulator;
   conducting a polishing process on the second interface surface;
   stacking the second substrate atop the first substrate, wherein the first and the second interface surfaces contact one another; and
   bonding the first and the second interface surfaces together using a hybrid bonding process, wherein:
      the first and the second metal layers are substantially aligned and bonded with one another using a eutectic bond; and
      the first and the second insulators are bonded with one another using a fusion bond.

10. The method of claim 9, further comprising fabricating the first and the second metal layers using identical metals.

11. The method of claim 9, further comprising fabricating the first and the second metal layers using different metals.

12. The method of claim 9, wherein at least one of an electroplating, electroless plating, or physical vapor deposition process is utilized to fabricate the first and the second metal layers.

13. The method of claim 9, wherein each of the first and the second insulators includes an oxide layer.

14. The method of claim 9, wherein the fabricating of the first metal layer includes:

forming a patterned photoresist layer directly atop the first conductive element, whereby the patterned photoresist layer provides openings exposing the first conductive element;

forming the first metal layer in the openings; and removing the patterned photoresist layer.

15. A method of fabricating a semiconductor device, the method comprising:

providing a first substrate having a first conductive element, the first conductive element including a first portion embedded within the first substrate and a second portion exposed at a surface of the first substrate;

forming a first metal feature over the first conductive element, wherein the first metal feature and the first conductive element are substantially aligned;

removing a portion of the first substrate to expose the first portion of the first conductive element;

forming a first oxide layer over the first metal feature and over the exposed first portion of the first conductive element such that the first oxide layer physically contacts the first portion of the first conductive element;

polishing the first oxide layer and the first metal feature;

providing a second substrate having a second conductive element;

forming a second metal feature over the second conductive element, wherein the second metal feature and the second conductive element are substantially aligned;

forming a second oxide layer over the second metal feature;

polishing the second oxide layer and the second metal feature; and bonding the first and the second substrates such that the first and the second metal features are substantially aligned and in contact, and the first and the second insulator layers are in contact.

16. The method of claim 15, wherein the first and the second conductive elements are of a first material, and wherein the first and the second metal features are of a second material different from the first material.

17. The method of claim 15, wherein the forming of the first metal feature includes:

forming a patterned photoresist layer over the first conductive element, whereby the patterned photoresist layer provides openings exposing the first conductive element;

forming the first metal layer at least in the openings; and removing the patterned photoresist layer.

18. The method of claim 15, wherein the bonding comprises utilizing a bonding temperature of between room temperature and 100 C.

19. The method of claim 15, wherein the first metal feature physically contacts the first conductive element, and the second metal feature physically contacts the second conductive element.

20. The method of claim 15, wherein forming the patterned photoresist layer over the first substrate includes forming the patterned photoresist layer directly on the first substrate such that the patterned photoresist layer physically contacts the first substrate.

* * * * *